United States Patent [19]

Tsinberg et al.

[11] Patent Number: 4,847,682

[45] Date of Patent: Jul. 11, 1989

[54] ADAPTIVE COMB FILTER FOR ARTIFACT-FREE DECODING

[75] Inventors: Mikhail Tsinberg, Bronx; Alan P. Cavallerano, Ossining; Carlo Basile, Flushing, all of N.Y.

[73] Assignee: North American Philips Corporation, New York, N.Y.

[21] Appl. No.: 134,713

[22] Filed: Dec. 18, 1987

[51] Int. Cl.[4] .............................................. H04N 9/78
[52] U.S. Cl. ................................................... 358/31
[58] Field of Search ........................................ 358/31

[56] References Cited

U.S. PATENT DOCUMENTS

| 4,072,984 | 2/1978 | Kaiser | 358/31 |
| 4,179,705 | 12/1979 | Faroudja | 358/31 |
| 4,240,105 | 12/1980 | Faroudja | 358/31 |
| 4,417,270 | 11/1983 | Nagao et al. | 358/36 |
| 4,626,894 | 12/1986 | Harwood et al. | 358/36 |

FOREIGN PATENT DOCUMENTS

| 0217649 | 8/1987 | European Pat. Off. |
| 0279702 | 2/1988 | European Pat. Off. |
| 150687 | 11/1980 | Japan | 358/31 |
| 151592 | 8/1984 | Japan | 358/31 |
| 57789 | 4/1985 | Japan | 358/31 |
| 2488 | 1/1986 | Japan | 358/31 |
| 186095 | 8/1986 | Japan | 358/31 |
| 2067872 | 7/1981 | United Kingdom | 358/31 |
| 2116393 | 9/1983 | United Kingdom | 358/31 |

Primary Examiner—John W. Shepperd
Attorney, Agent, or Firm—Michael E. Marion

[57] ABSTRACT

An adaptive comb filter employs vertical and horizontal edge detectors to selectively activate a vertical high-pass filter and a horizontal band-pass filter during the occurrence of vertical and horizontal edges in a received television signal, for use in the chrominance/luminance separation process. Artifacts such as "hanging dots" and "crawling dots", inherent in prior art comb filter circuits during the occurrence of vertical and horizontal edges in the composite television signal, are greatly reduced in the process.

4 Claims, 4 Drawing Sheets

ADAPTIVE COMB FILTER FOR ARTIFACT-FREE DECODING

BACKGROUND OF THE INVENTION

The present invention relates generally to television receivers. More specifically, the present invention relates to a method and apparatus for adaptively comb filtering a television signal so that the chrominance and luminance components may be decoded without unwanted artifacts.

"Artifacts", as used in the body of the present letters patent refers to disturbances appearing on the display device of a television receiver resulting from the separation of the chrominance and luminance components of a received composite video signal, usually in the form of so called cross-luminance or cross-chrominance effects (also known as hanging dots and crawling dots).

Prior art comb filter circuits, while improving on the resolution of the decoded television signals, as compared to older methods using only horizontal filtering techniques, produce the above-mentioned artifacts during the separation process. These artifacts are exacerbated in the display of receivers employing prior art comb filters--especially during the occurrence of vertical and horizontal edges. Edges may be defined as regions of sharp transitions in either luminance or chrominance.

SUMMARY OF THE INVENTION

It is an object of this invention to provide an adaptive comb filter which reduces "crawling dots" in a displayed television signal.

It is also an object to provide an adaptive comb filter which reduces "hanging dots" in a displayed television signal.

Another object of this invention is to provide an adaptive comb filter which reduces other cross-luminance or cross-chrominance artifacts associated with the use of prior art comb filters.

A further object of this invention is to meet the above objects using a simple hardware implementation.

The above objects and others of the invention are realized by providing an adaptive comb filter which selectively employs a vertical high-pass filter and a horizontal band-pass filter for decoding. A vertical edge detector detects vertical edges in the composite signal (where hanging dots often occur), thus causing the chroma separation to be effected only by the horizontal band-pass filter during those times. A horizontal edge detector detects horizontal edges in the composite signal (where dot crawl often occur), thus causign the chroma separation to be effected only by the vertical high-pass filter during those times. When both vertical and hozizontal edges occur default logic in the circuitry causes only the horizontal band-pass filter to be active.

BRIEF DESCRIPTION OF THE DRAWINGS

The present invention is described by the specification with reference to the accompanying drawings. Briefly described, the drawings are.

DETAILED DESCRIPTION OF THE INVENTION

Figure 1:
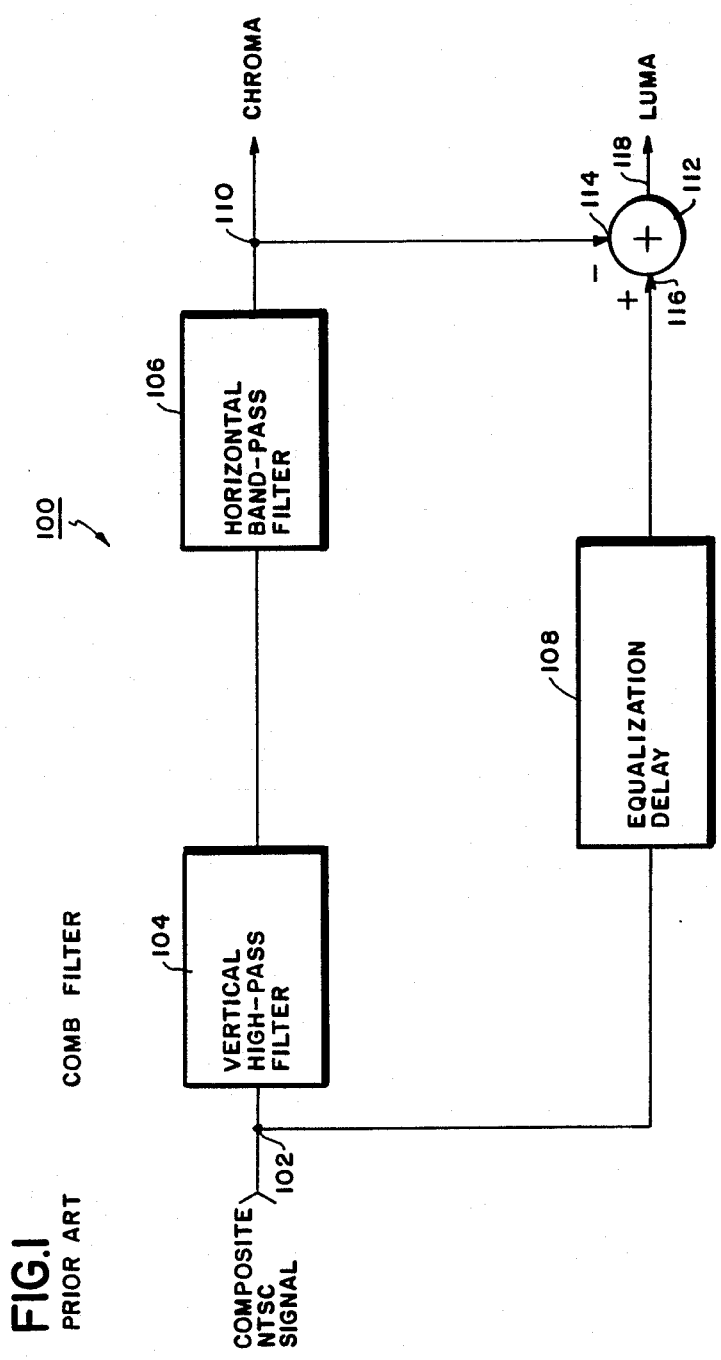
FIG. 1 is a schematic block diagram of a prior art comb filter circuit.

FIG. 1 shows a a typical comb filter circuit 100 used to decode a composite television signal. In this case a digitized composite NTSC signal, previously broadcast in analog form, is applied via a filter input 102 to a first branch having a vertical high-pass filter 104 and a horizontal band-pass filter 106, and to a second branch having an equalization delay 108 and an adder 112.

The vertical high-pass filter outputs a signal having characteristics of the chrominance component of the composite NTSC signal. This signal is processed by a horizontal band-pass filter 106 which outputs the decoded chrominance component at output 110. After being passed through an equalization delay 108 to compensate for the delays caused by the vertical high-pass filter 104 and the horizontal band-pass filter, the composited NTSC signal is applied to the positive input 116 of the adder 112, and the chrominance component or chrominance signal is applied to the negative input 114 of the adder 112. The subtraction of the chrominance component from the composite signal by the adder 112 causes a luminance component at output 118 of the circuit.

As previously discussed, the prior art comb filter circuit 100 introduces artifacts at the occurrence of vertical and horizontal edges in the composite signal. Hence the present adaptive comb filter circuit 200 in FIG. 2 was made to eliminate this problem.

A composite NTSC signal to be decoded is applied at a filter input 202 at an input 204 of a vertical high-pass filter 206, to an input 208 of a vertical edge detector 210, and to an input 212 of vertical equalization delay 214. The vertical high-pass filter 206 processes the composite signal in the manner described supra.

The vertical edge detector 210 outputs a detection (or control) signal at output 211 to paths 222 and 224 during the occurrence of vertical edges. The vertical equalization delay merely compensates for the delays in the elements of the other branches of the circuit mentioned heretofore. The output of the vertical high-passed filter 206 is pass through an equalization delay 216 and applied to a first switching input 218 of a first switching circuit 220. The second input 228 of the switching circuit 220 is the delayed composite signal received via element 214. A control input 222 of the switching circuit 220 is connected to the vertical edge detector 210, and receives a control signal therefrom, to direct the switching circuit 220 to switch to the appropriate switching input in the following manner.

The switch in the switching circuit 220 normally in the position shown, i.e., connected to input 218, during the operation of the circuit 200 (for the case when no vertical edges are present). However, when the vertical edge detector detects a vertical edge in the composite NTSC signal, the control signal output from output 211 to control signal input 222 causes the switching circuit 220 to switch to input 228. In other words, as long as no vertical edges are present the signal from the vertical high-pass filter is passed by the switch 220. Since the vertical high-pass filter introduces artifacts during the occurrence of vertical edges, the path containing the vertical high-pass filter is open circuited during vertical edges by the vertical edge detector 210 in that the control signal causes the switching circuit to choose input 228 (the composite signal). Thus, although there is a possible brief reduction in vertical resolution, hanging dots are eliminated. The switch in the switching circuit 220 is reconnected to input 218 when the vertical edges have passed.

The signal chosen by the first switching circuit 220 is applied to horizontal band-pass filter 232 (via input 230) and to an equalization delay 236 (via input 234), with the path 238 or 240 being chosen by a second switching circuit 242. The second switching circuit 242 outputs a chrominance signal at output 254.

The horizontal edge detector 246 receives the composite signal at its input 244, and operates similarly to the manner of the vertical edge detector 210, except that horizontal edges are detected. During the occurrence of horizontal edges the horizontal edge detector 246 outputs a control signal at output 247, which if directly connected to the second switching circuit 242, would cause path 240 to be chosen. In other words, to prevent crawling dots, etc., the horizontal edge detector 246 by itself would have the second switching circuit choose the path without the horizontal band-pass filter 232 during the occurrence of horizontal edges, and would cause the second switching circuit 242 to switch back to path 238 during non-horizontal edges.

However, there is a possibility that vertical and horizontal edges may occur simultaneously. When this happens the circuit described heretofore would pass an unprocessed signal to the output 254, thereby failing to decode the composite NTSC signal. A logic circuit 252, connected at a first input 248 to the control signal of the horizontal edge detector 246 and at a second input 250 to the control signal of the vertical edge detector 210 via an equalization delay 226, is introduced to correct this problem. The logic circuit 252 sends a logic control signal to the control input 243 of the second switching circuit 242 for determination of the switching inputs to the said switching circuit. A simple embodiment of the logic circuit may be, for example, a logical AND gate with the first of its two inputs connected to input 248 and the second of its inputs connected to an inverted version of the signal received at input 250. This configuration always causes the second switching circuit 242 to choose path 238 during the occurrence of vertical edges in order to avoid passing an unprocessed signal to output 254, and causes the second switching circuit 242 to choose either path 238 or path 240 during the non-vertical edges, depending on whether horizontal edges are present.

The chrominance signal is applied to a negative input 256 of an adder 264, while the composite signal, additionally delayed at input 258 by a horizontal equalization delay 260, is applied to the positive input 262. The subtraction of the chrominance signal from the composite signal by the adder 264 gives the luminance component at the output 266.

Figure 3:
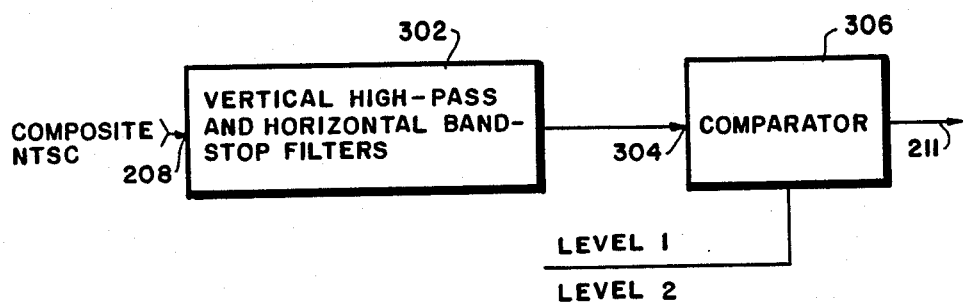
FIG. 3 is a schematic diagram of a vertical edge detector for use in the adaptive comb filter circuit of FIG. 2.

An embodiment for a vertical edge detector 210 is shown in FIG. 3. The composite NTSC signal is applied at an input 208 of a vertical high-pass filter followed by a horizontal band-stop filter 302 (alternatively described as a two-dimensional band-pass filter), which removes chroma from the composite signal, and passes the remainder of the composite signal to an input 304 of a comparator 306. The output of the horizontal band-stop filter 302 only changes when vertical luma edges are present. The comparator 306 compares the change with level 1 and level 2, makes a decision about the presence of a vertical edge, and outputs a control signal at output 211.

Figure 4:
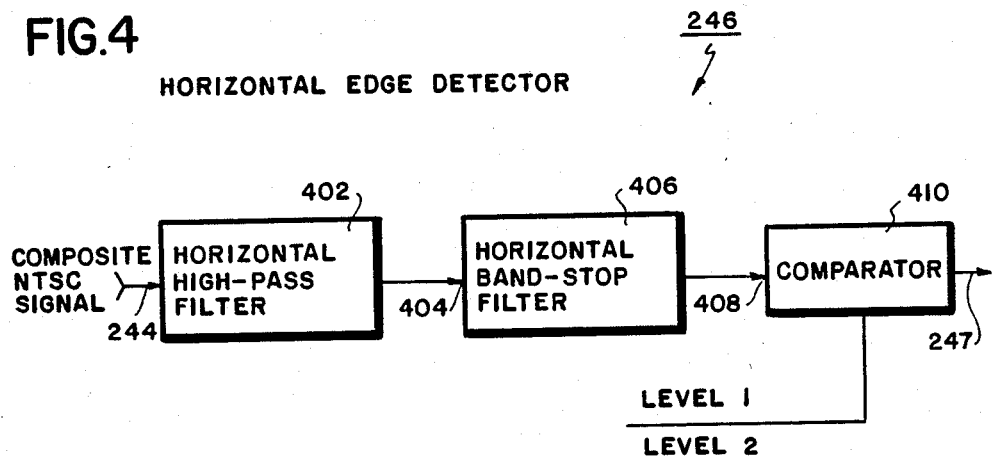
FIG. 4 is a schematic block diagram of a horizontal edge detector for use in the adaptive comb filter circuit of FIG. 2.

An embodiment for a horizontal edge detector 246 is shown in FIG. 4. This detector functions similarly to the vertical edge detector 210. Unlike the vertical edge detector 210 the horizontal edge detector 246 includes a horizontal high-pass filter 402 with an input 244 coupled to the composite NTSC signal. The horizontal high-pass filter 402 removes low-frequency components and outputs the filtered signal to an input 404 of a horizontal band-stop filter 406, and the output of the horizontal band-stop filter is forwarded to an input 408 of a comparator 410. The horizontal band-stop filter 406 and the comparator 410 operate in the same manner as corresponding components of the vertical edge detector 210. The control signal output at location 247 indicates the presence and non-presence of horizontal luma edges.

Figure 5:
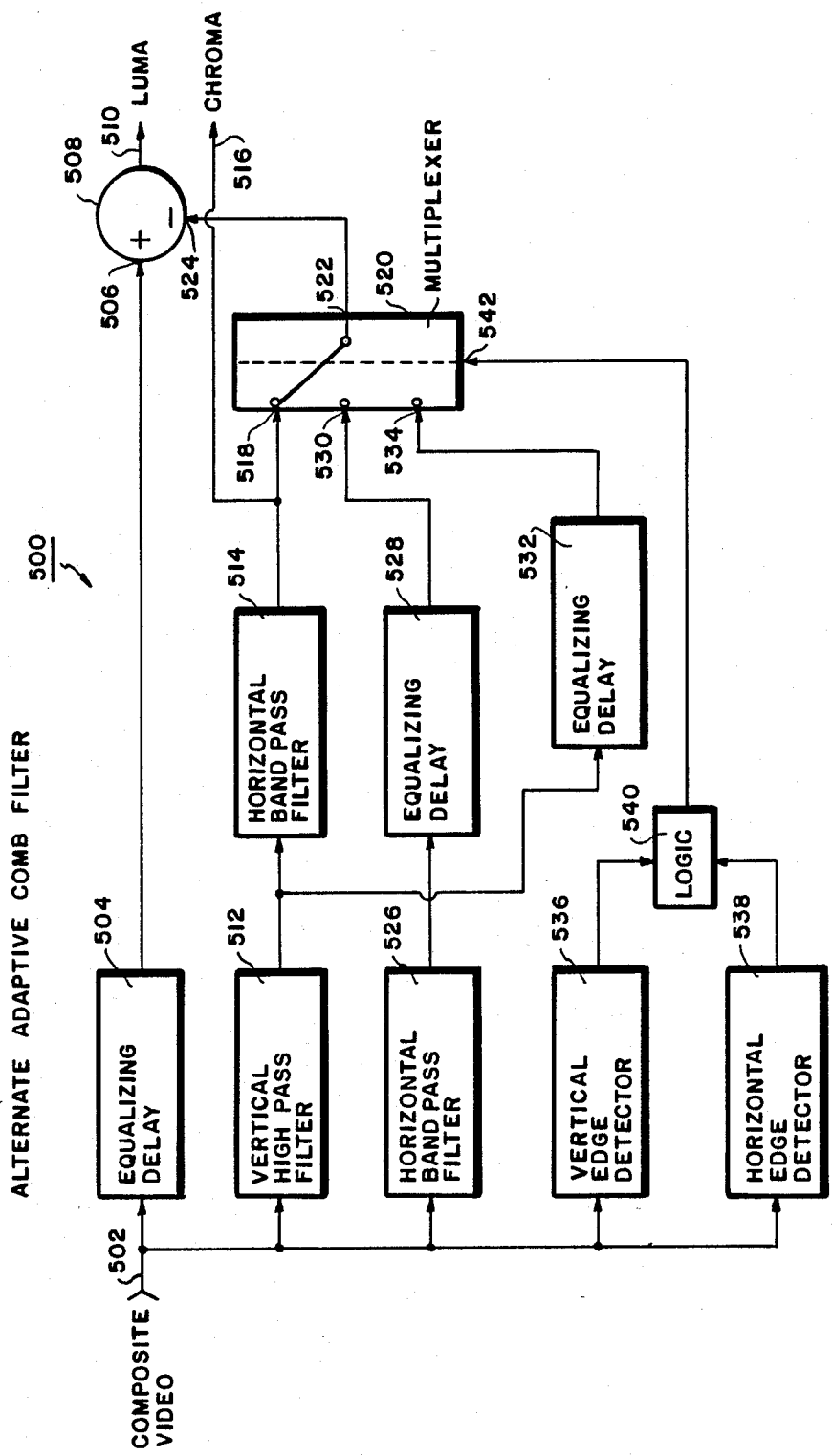
FIG. 5 is a schematic block diagram of an alternate embodiment of the present invention adaptive comb filter circuit.

An alternate embodiment 500 of the present invention appears in FIG. 5. This circuit functions substantially identical to the circuit 200 in FIG. 2, with a multiplexer being substituted for the switching circuits 220 and 242, and an additional horizontal band-pass filter being added. The circuit will be only briefly described here since the basic concepts were presented earlier. A composite video signal is applied to a filter input 502 where it is passed via an equalizing delay 506, to the positive input 506 of a subtracter circuit 508. The subtracter circuit 508 outputs a luminance signal at output 510.

A multiplexer 520 selects from one of three inputs, a signal to be applied to the negative input 524 of the subtracter circuit 508. A first multiplexer input path sends the composite video signal through a vertical high-pass filter 512, and and then through a horizontal band-pass filter 514. A chrominance signal emanates from this path via an output 516. The output of this path is also connected to an input 518 of a multiplexer 520.

A second multiplexer input path sends the composite signal through a second horizontal band-pass filter 526, through an equalization delay 528, and finally to a second input 530 of the multiplexer 520.

A third multiplexer input path sends the composite signal through the vertical high-pass filter 512, through an equalizing delay 532, and to a third input 534.

The vertical and horizontal edge detectors 536 and 538, respectively operate as described supra, to detect edges in the composite signal. A logic circuit 540 sends a control signal to the control input 542 of the multiplexer 520 based on input stimuli received from the edge detectors and internal default logic, such that when no edges are present, input 518 is chosen, when vertical and horizontal edges or vertical edges alone are present, input 530 is chosen, and when only horizontal edges are present, input 534 is chosen.

The output 522 of the multiplexer 520 is applied to the negative input 524 of the subtracter circuit 508.

Variations and modifications to the present invention are possible given the above disclosure. However, variations and modifications which are obvious to those skilled in the art are intended to be within the scope of this letters patent. For example, the embodiments representing the edge detectors may differ from those shown.

Figure 2:
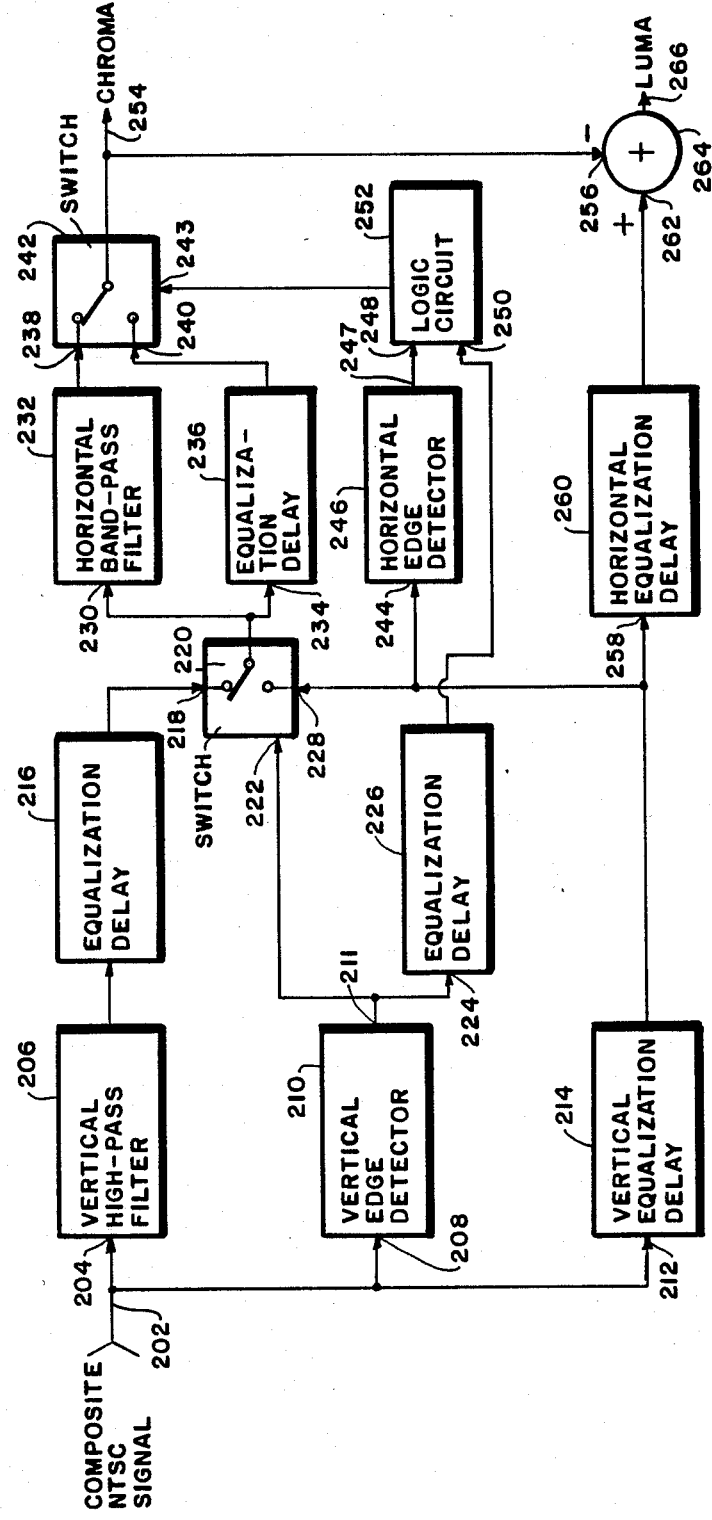
FIG. 2 is a schematic block diagram of an embodiment of the present invention adaptive comb filter circuit.

Also, the edge detectors may be placed at locations other than those shown in FIGS. 2 or 5.

The subject matter which we claim as our invention comprises the descriptions in the following claims:

1. An adaptive comb filter comprising:
   a filter input for receiving a composite video signal;
   a first switching path coupled at its input to said filter input having a vertical high-pass filtering means for vertically filtering said composite video signal;
   a second switching path coupled at its input to said filter input;
   a first switching means coupled at a first input to the output of the first switching path, coupled at a second input to the output of said second switching path, and having a control input;
   a third switching path coupled at its input to the output of said first switching means having a horizontal band-pass filtering means for horizontally filtering the signal received at its input;
   a fourth switching path coupled to the output of said first switching means;
   a second switching means having a first input coupled to said third switching path, a second input coupled to said fourth switching path, and a control input;
   a subtracter means coupled to the output of said second switching means and to said second switching path, for subtracting the output of said second switching means representing a chrominance signal from the composite video signal received from the output of said second switching path, and producing a luminance signal at its output;
   a vertical edge detection means coupled at its input to said filter input, for outputting a vertical control signal via an output coupled to the control input of said first switching means, wherein said vertical edge detection means determines the presence of vertical edges in said composite video signal, and said vertical control signal causes said first switching means to switch to said second switching path during the occurrence of vertical edges and said vertical control signal causes said first switching means to switch to said first switching path at all other times;
   a horizontal edge detection means coupled at its input to said filter input, for outputting a horizontal control signal via an output coupled to the control input of said second switching means, wherein said horizontal edge detection means determines the presence of horizontal edges in said composite video signal; and
   a logic switching control means coupled at its inputs to the outputs of said vertical and horizontal edge detectors for outputting a switching control signal to the control input of said second switching means, wherein said switching control signal causes said second switching means to switch to said fourth switching path during the occurrence of horizontal edges, except that said second switching means switches to said third switching path during the presence of both vertical and horizontal edges, and said switching control signal causes said second switching means to switch to said third switching path at all other times.

2. An adaptive comb filter comprising:
   a filter input for receiving a composite video signal;
   a first multiplexing path coupled at its input to said filter input having a vertical high-pass filtering means and a horizontal filtering means for vertically and horizontally filtering said composite video signal, respectively, and for outputting a chrominance signal;
   a second multiplexing path coupled at its input to said filter input comprising said vertical high-pass filter;
   a third multiplexing path coupled at its input to said filter input having a second horizontal filtering means;
   a multiplexing means having a first input coupled to said first multiplexing path, a second input coupled to said second multiplexing path, a third input coupled to said third multiplexing path, and a control input;
   a subtracter means coupled to the output of said multiplexing means and to said filter input, for subtracting the output of said multiplexing means from the composite video signal, producing a luminance signal at its output;
   a vertical edge detection means coupled at its input to said filter input, for outputting a vertical control signal, wherein said vertical edge detection means determines the presence of vertical edges in said composite video signal, and said vertical control signal assumes a first state during the occurrence of vertical edges and said vertical control signal assumes a second state at all other times;
   a horizontal edge detection means coupled at its input to said filter input, for outputting a horizontal control signal, wherein said horizontal edge detection means determines the presence of horizontal edges in said composite video signal, and said horizontal control signal assumes a first state during the occurrence of horizontal edges and said horizontal control signal assumes a second state at all other times; and
   a logic switching control means coupled at its inputs to the outputs of said vertical and horizontal edge detectors for outputting a switching control signal to the control input of said multiplexing means, wherein said switching control signal causes said multiplexing means to switch to said second multiplexing path during the occurrence of horizontal edges, to said third multiplexing path during the presence of either vertical edges or simultaneous vertical and horizontal edges, or to said first multiplexing path when no horizontal or vertical edges are detected.

3. An adaptive comb filter comprising:
   (a) a filter input for receiving a composite video signal;
   (b) first filtering means coupled to said filter input, for filtering said composite video signal;
   (c) first switching means having a first input coupled to said filter input, a second input coupled to said first filtering means, and a switch output, for switchably connecting to said switch output, either said filter input or said first filtering means in response to a first control signal;
   (d) vertical edge detection means coupled to said filter input, for detecting the presence of vertical edges in said composite video signal and for providing said first control signal in response thereto;
   (e) second filtering means coupled to said switch output;
   (f) second switching means having a first input coupled to said second filtering means, a second input coupled to said switch output, and a chrominance output, for switchably connecting either said first switch output or second filtering means to said chrominance output in response to a second control signal;

(g) horizontal edge detection means coupled to said filter input for detecting the presence of horizontal edges in said composite video signal and providing said second control signal in response thereto; and (h) subtracter means coupled to said chrominance output and said filter input, for subtracting a signal provided at said chrominance output from said composite video signal so as to provide a luminance signal.

4. The adaptive comb filter of claim 3 further comprising means coupled to said vertical edge detection means and said horizontal edge detection means for connecting said second filtering means to said chrominance output when vertical and horizontal edges are simultaneously detected.

* * * * *